United States Patent [19]
Chittipeddi

[11] Patent Number: 5,589,416
[45] Date of Patent: Dec. 31, 1996

[54] PROCESS FOR FORMING INTEGRATED CAPACITORS

[75] Inventor: Sailesh Chittipeddi, Austin, Tex.

[73] Assignee: Lucent Technologies Inc., Murray Hill, N.J.

[21] Appl. No.: 568,040

[22] Filed: Dec. 6, 1995

[51] Int. Cl.$^6$ ............................................. H01L 21/70
[52] U.S. Cl. ................... 437/60; 437/47; 437/52; 437/919; 148/DIG. 14
[58] Field of Search ........................... 437/47, 48, 52, 437/60, 919; 148/DIG. 14

[56] References Cited

U.S. PATENT DOCUMENTS

| | | | |
|---|---|---|---|
| 5,130,267 | 7/1992 | Kaya et al. | 437/919 |
| 5,173,437 | 12/1992 | Chi | 437/60 |
| 5,227,325 | 7/1993 | Gonzalez | 437/60 |
| 5,356,826 | 10/1994 | Natsume | 437/47 |
| 5,470,775 | 11/1995 | Nariani | 437/52 |

*Primary Examiner*—Tuan H. Nguyen

[57] ABSTRACT

Disclosed is a technique for forming integrated capacitors using a sequence of process steps that is fully compatible with standard silicon gate MOS integrated circuit processing. The capacitor comprises a polysilicon-oxide-TiN/metal combination. The lower plate, i.e. polysilicon plate, is interconnected at the gate level and the upper plate is interconnected typically at metal one.

5 Claims, 2 Drawing Sheets

PROCESS FOR FORMING INTEGRATED CAPACITORS

FIELD OF THE INVENTION

The invention relates to an integrated circuit process for forming a capacitor structure in series with an MOS gate capacitor. The capacitor is formed conventional MOS transistor devices.

BACKGROUND OF THE INVENTION

Techniques for integrating a variety of functional devices in a single integrated circuit by using a common sequence of processing steps are well known in the art. A common approach to forming a capacitor in an MOS process is to replicate the MOS gate structure at some other place on the chip. In this structure the substrate is one capacitor plate and a polysilicon plate, formed during the gate poly deposition, forms the other capacitor plate. In this approach the properties of the capacitor dielectric, e.g. the thickness, is limited by the MOS gate dielectric thickness. Moreover, using this procedure the choice of possible circuit configurations is limited. An additional drawback is that an additional substrate contact is generally required. Alternative approaches are known in which capacitors are formed using a three level metal process. In this case a capacitor can be formed that is electrically distinct from the gate, i.e. can be independently designed and interconnected, but an added metal layer is required in the gate-capacitor structure, i.e. the combination gate/capacitor uses three metal layers. By contrast only two metal layers are required to form the capacitor and the gate structures using the process of this invention.

STATEMENT OF THE INVENTION

According to this invention a technique for making a capacitor structure in an MOS process uses the MOS gate electrode deposition step to form one plate of the capacitor. The capacitor dielectric is formed using a hardmask layer thereby giving added design freedom for the properties of the capacitor. The second capacitor plate is formed during the second level metal step. Using this sequence the capacitor can be interconnected independently of the gates, and the constraints on the capacitor dielectric are relaxed compared with other processes in which MOS capacitors are formed concurrently with MOS transistors.

DETAILED DESCRIPTION

Figure 1:
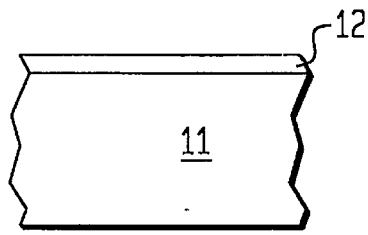
FIGS. 1–11 are schematic representations of the process steps of the invention.

Referring first to FIG. 1 there is shown a semiconductor substrate 11, typically silicon, with an overlying dielectric layer 12, such as silicon dioxide. The silicon dioxide layer 12 is the field oxide in the integrated circuit and typically has a thickness of 0.1 micron to 3.0 microns. This layer is usually grown by well known thermal or plasma techniques after which it is patterned and the thin gate dielectric layer grown in the regions exposed by the patterning step. Alternatively, layer 12 may represent the gate dielectric, i.e. formed during the gate dielectric growth step. As such it is typically 10 Angstroms to 500 Anstroms in thickness and is also grown. The choice of locating the capacitor in the field region or overlying the gate depends inter alia on the function of the capacitor in the overall circuit. For example the capacitor can be incorporated in the gate structure to form a floating gate for a programmable device. More generally though the-capacitor will be formed on the field dielectric thereby giving greater design flexibility and process latitude.

Figure 2:
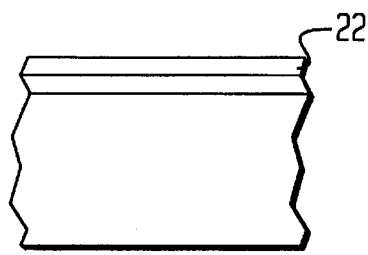

Referring to FIG. 2 a layer 21 of polysilicon is deposited over the dielectric layer 12. The polysilicon layer is the gate poly layer used to form the gates of the transistors (not shown) and is typically between 200 Angstroms and 5000 Angstroms in thickness. The polysilicon layer may be deposited by any of several known techniques, e.g. CVD.

Patterning of the gate level polysilicon layer is frequently done using photoresist directly on the polysilicon layer. Alternatively it is done using an oxide mask layer. As will be evident from the description that follows, the poly patterning step in this process necessarily involves an oxide hardmask because the oxide hardmask also serves as the capacitor dielectric in the final structure. Since the requirements of the oxide layer for masking purposes are undemanding, the properties and thickness of the hardmask can be tailored for the capacitor dielectric function, thus giving design flexibility. For example, the material of the hardmask can be chosen from the group consisting of silicon dioxide (e.g. TEOS), BPTEOS, and dual layers such as $TEOS/Si_3N_4$ and TEOS/BPTEOS depending on the properties desired for the capacitor. In this description the hardmask and capacitor dielectric is $SiO_2$.

Figure 3:
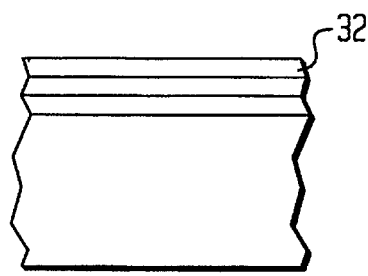

FIG. 3 shows the deposited oxide hardmask layer 32, prior to patterning. The layer 32 typically has a thickness of 300 Angstroms to 5000 Angstroms and is deposited by conventional techniques, e.g. CVD.

Figure 4:
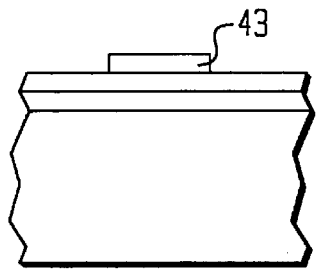

The oxide hardmask is shown patterned at 43 in FIG. 4. The etch step to pattern layer 32 to form the mask pattern 43 may be a known plasma etch using photoresist. In patterning layer 32 the etch step may be continued until the portions exposed by the patterned photoresist are completely removed, or alternatively, layer 32 may be etched partially through its thickness at this point, and the remainder of the layer 32 removed after photoresist stripping during, e.g., the subsequent poly etch step.

Figure 5:
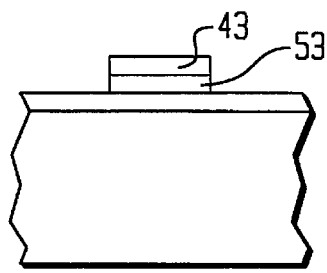

Using the pattern 43 as a mask, poly layer 22 is etched using known techniques to form the structure appearing in FIG. 5. Field oxide 12 remains intact. As will be evident to those skilled in the art this etch step is the step used to form the polysilicon gates in the conventional self-aligned gate process.

Typically at this stage in the process the source and drain windows of the transistors are opened and the lightly doped source and drain implants performed. While not directly a part of this invention this is mentioned to further demonstrate the compatibility of the sequence of this process with the overall IC process, an important aspect of this invention.

Figure 6:
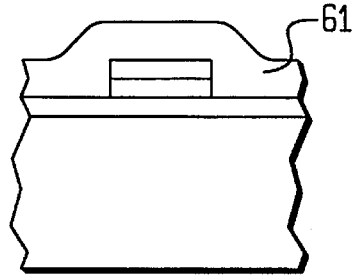
Figure 7:
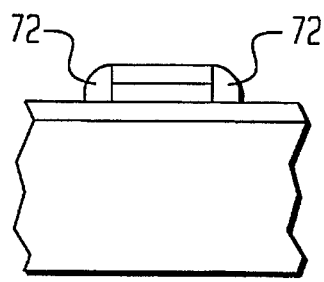

A further indication of that compatibility is evident in the steps represented by FIGS. 6 and 7. Here sidewall spacers 72 (FIG. 7) are formed at the sidewalls of the stacked structure. The sidewall spacers are formed simultaneously with the sidewall spacers conventionally formed on the transistor gates. These spacers allow the formation of lightly doped drains adjacent to the transistor gates and a heavier doping region spaced from the gates by the masking effect of the spacers. The spacers 72 in the capacitor structure according to this invention do not perform a similar function but are advantageous in obtaining good step coverage in subsequent processing. The spacers 72 are formed in the conventional way by depositing a thick oxide layer, typically TEOS as shown at 61 in FIG. 6, and etching that layer using an anisotropic plasma etch to remove the oxide on the planar regions but leaving oxide on the sidewalls as shown at 72 in FIG. 7.

Figure 9:
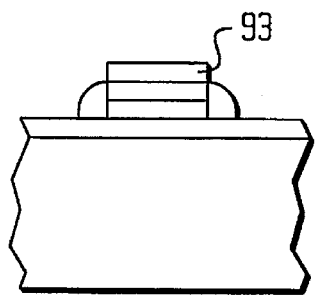
Figure 8:
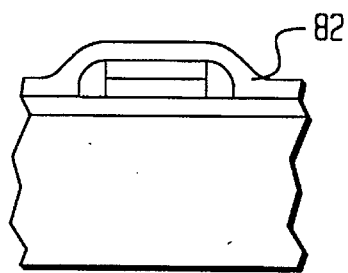

The next step in the process is to form the upper conductor plate of the capacitor. The upper plate may be e.g. titanium nitride formed from a blanket deposit as shown at 82 in FIG. 8. The thickness of the TiN layer may be of the order of 500–5000 Angstroms and the deposition technique is typically plasma CVD. The layer 82 is masked using the same mask used to form the hardmask 53 shown in FIG. 5, and is patterned by known plasma etch steps to form the structure of FIG. 9. Alternative materials for the conductor plate will occur to those skilled in the art.

Figure 10:
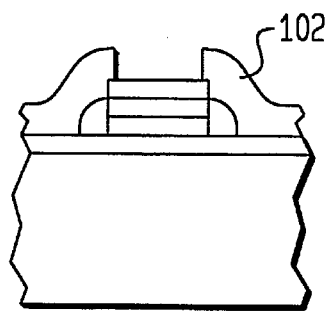

The next step is to deposit another thick oxide layer, using TEOS for example, and mask and etch the layer to produce layer 102 with contact windows to plate 93 as shown in FIG. 10. This oxide layer serves generally in the overall IC process as an interlevel dielectric and is typically 0.1 micron to 3.0 microns in thickness. Layer 102 may alternatively consist of a dual layer of, e.g. TEOS and BPTEOS.

Figure 11:
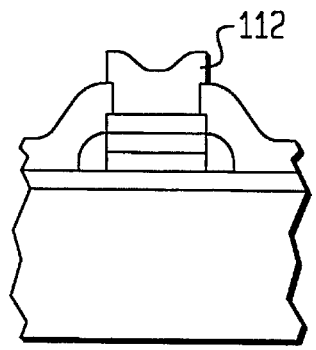

A metal contact 112 is formed in the contact window as shown in FIG. 11. The contact is produced by conventional deposition, masking and etching. The metal may be aluminum, or may be a refractory layer such as polysilicon, titanium silicide or cobalt silicide if it is part of an intermediate metallization layer.

Capacitors made according to the techniques described here may be floating, i.e. capacitively connected to underlying or overlying conductor plates, or may be interconnected in the usual manner by the steps represented by FIGS. 10 and 11.

Various additional modifications of the invention as described in the foregoing pages will occur to those skilled in the art. All such variations that rely basically on the advances through which this invention has advanced the art are properly considered to be within the scope of this invention and equivalents thereof.

I claim:

1. Process for the manufacture of an integrated circuit including a capacitor, the capacitor comprising a first plate, a capacitor dielectric, and a second plate, the process comprising the steps of:

a. growing a field oxide layer on a silicon substrate, b. depositing a layer of polysilicon on the field oxide, c. depositing a capacitor dielectric layer comprising silicon dioxide on the polysilicon layer, d. lithographically forming a pattern in the capacitor dielectric layer to form an oxide hardmask, said pattern defining a mask for the first plate of said capacitor, and said mask also serving as the capacitor dielectric, e. removing the unmasked portions of the polysilicon layer using the oxide hardmask as an etch mask, thereby exposing portions of the field oxide, f. forming a blanket insulating layer over the oxide hardmask and the exposed portions of the field oxide, g. anisotropically etching said blanket insulating layer to form sidewall spacers on the vertical edges of the etched polysilicon and hardmask of the capacitor, h. depositing a blanket layer of titanium-nitride, i. masking the titanium layer with a mask corresponding essentially to the mask used to form the hardmask, j. patterning the titanium nitride layer to form the second plate of the capacitor, k. depositing an insulating layer over the patterned titanium nitride layer, l. opening a contact window to said second plate of the capacitor, m. depositing a metal layer over the contact window, and n. etching said metal layer to form a contact to said second capacitor plate.

2. The process of claim 1 wherein the capacitor dielectric layer is selected from the group consisting of silicon dioxide, TEOS, BPTEOS, $Si_3N_4$, and dual layers thereof.

3. The process of claim 1 wherein the insulating layer of step k in the process comprises TEOS.

4. The process of claim 3 wherein the insulating layer of step k is a dual layer of TEOS and BPTEOS.

5. The process of claim 1 wherein the TiN layer has a thickness in the range of 500–5000 Angstroms and is deposited by plasma CVD.

* * * * *